US010062845B1

(12) United States Patent
Gee et al.

(10) Patent No.: US 10,062,845 B1
(45) Date of Patent: Aug. 28, 2018

(54) FLATNESS OF MEMORY CELL SURFACES

(71) Applicant: Crossbar, Inc., Santa Clara, CA (US)

(72) Inventors: Harry Yue Gee, Santa Clara, CA (US); Zhen Gu, Cupertino, CA (US); Natividad Vasquez, San Francisco, CA (US); Sundar Narayanan, Cupertino, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 15/592,982

(22) Filed: May 11, 2017

Related U.S. Application Data

(60) Provisional application No. 62/335,783, filed on May 13, 2016.

(51) Int. Cl.
*H01L 21/77* (2017.01)
*H01L 21/8239* (2006.01)
*H01L 23/00* (2006.01)
*H01L 45/00* (2006.01)
*G11C 11/56* (2006.01)

(52) U.S. Cl.
CPC ...... *H01L 45/1608* (2013.01); *H01L 45/1233* (2013.01); *H01L 45/1253* (2013.01); *H01L 45/145* (2013.01); *H01L 45/146* (2013.01); *H01L 45/148* (2013.01)

(58) Field of Classification Search
CPC ....... H01L 45/06; H01L 45/14; H01L 45/122; H01L 45/145–45/147; H01L 45/1233–45/124; H01L 45/16; H01L 45/1608; H01L 45/1666–45/1691; H01L 45/08–45/085; H01L 45/10; H01L 2224/03616; H01L 2224/03845; H01L 2224/11616; H01L 2224/11845; H01L 2224/27616; H01L 2224/27845; G11C 11/5614–11/5692

See application file for complete search history.

(56) References Cited

U.S. PATENT DOCUMENTS

| | | | |
|---|---|---|---|
| 7,102,150 B2 * | 9/2006 | Harshfield | H01L 21/288 257/2 |
| 7,129,167 B1 | 10/2006 | Bailey, III et al. | |
| 7,355,324 B2 * | 4/2008 | Kim | H03H 3/02 310/320 |

(Continued)

OTHER PUBLICATIONS

"Two-Terminal Resistive Switches (Memristors) for Memory and Logic Applications," Lu et al., IEEE, 2011.*

(Continued)

*Primary Examiner* — Maliheh Malek
(74) *Attorney, Agent, or Firm* — Amin, Turocy & Watson, LLP

(57) ABSTRACT

A two-terminal memory device can be formed according to a manufacturing process that utilizes two distinct chemical-mechanical planarization (CMP) processes for each of bottom electrode/terminal (BE) and the top electrode/terminal (TE). The CMP processes can reduce planar height variations for a top surface of the BE and a top surface of the TE. The CMP processes can reduce height differences between the top surface of the BE and adjacent dielectric surfaces and reduce height differences between the top surface of the TE and adjacent dielectric surfaces.

20 Claims, 13 Drawing Sheets

(56) References Cited

U.S. PATENT DOCUMENTS

| | | | | |
|---|---|---|---|---|
| 7,510,929 B2* | 3/2009 | Chen | | H01L 45/04 257/614 |
| 7,642,695 B2* | 1/2010 | Fujii | | H03H 9/02133 310/311 |
| 8,287,943 B2* | 10/2012 | Lucat | | B81C 99/0095 257/E27.006 |
| 8,519,485 B2* | 8/2013 | Herner | | H01L 45/148 257/2 |
| 8,750,019 B2* | 6/2014 | Lu | | G11C 13/0002 257/2 |
| 8,815,696 B1* | 8/2014 | Herner | | H01L 27/2463 257/E21.613 |
| 8,884,261 B2* | 11/2014 | Jo | | G11C 13/0009 257/4 |
| 8,946,046 B1* | 2/2015 | Jo | | H01L 21/4763 257/2 |
| 8,993,397 B2* | 3/2015 | Herner | | H01L 45/148 257/E21.233 |
| 9,036,400 B2* | 5/2015 | Lu | | G11C 13/0002 257/2 |
| 9,425,046 B1* | 8/2016 | Gee | | H01L 21/02664 |
| 9,437,814 B1* | 9/2016 | Gee | | H01L 45/1233 |
| 9,583,701 B1* | 2/2017 | Gee | | H01L 45/1266 |
| 9,595,670 B1* | 3/2017 | Gee | | H01L 45/085 |
| 9,627,443 B2* | 4/2017 | Jo | | G11C 13/0007 |
| 9,735,358 B2* | 8/2017 | Jo | | H01L 45/146 |
| 9,741,765 B1* | 8/2017 | Narayanan | | H01L 45/1233 |
| 2006/0186759 A1* | 8/2006 | Kim | | H03H 3/02 310/320 |
| 2007/0232015 A1* | 10/2007 | Liu | | H01L 45/06 438/396 |
| 2008/0001137 A1* | 1/2008 | Kozicki | | B82Y 10/00 257/4 |
| 2008/0116437 A1* | 5/2008 | Oh | | H01L 45/06 257/2 |
| 2009/0098678 A1* | 4/2009 | Lung | | H01L 45/06 438/54 |
| 2009/0152737 A1* | 6/2009 | Harshfield | | H01L 29/45 257/774 |
| 2010/0048007 A1* | 2/2010 | Lee | | B24B 37/042 438/585 |
| 2010/0072515 A1 | 3/2010 | Park et al. | | |
| 2010/0109106 A1 | 5/2010 | Zhong et al. | | |
| 2010/0124818 A1* | 5/2010 | Lee | | H01L 21/82380 438/589 |
| 2010/0155687 A1* | 6/2010 | Reyes | | H01L 45/04 257/4 |
| 2011/0001108 A1* | 1/2011 | Greene | | H01L 27/2436 257/2 |
| 2011/0059557 A1* | 3/2011 | Yamagishi | | H01L 27/228 438/3 |
| 2011/0168966 A1* | 7/2011 | Lam | | H01L 45/06 257/3 |
| 2011/0312151 A1* | 12/2011 | Herner | | H01L 45/148 438/384 |
| 2012/0015506 A1* | 1/2012 | Jo | | H01L 45/085 438/482 |
| 2012/0193785 A1 | 8/2012 | Lin et al. | | |
| 2012/0235112 A1* | 9/2012 | Huo | | H01L 45/085 257/4 |
| 2013/0037777 A1* | 2/2013 | Mikawa | | H01L 21/76807 257/4 |
| 2013/0062586 A1* | 3/2013 | Ren | | H01L 45/1253 257/4 |
| 2013/0082231 A1 | 4/2013 | Tada et al. | | |
| 2013/0134379 A1* | 5/2013 | Lu | | G11C 13/0002 257/4 |
| 2013/0140513 A1* | 6/2013 | Lai | | H01L 45/06 257/4 |
| 2013/0187109 A1* | 7/2013 | Tan | | G11C 16/10 257/2 |
| 2014/0084233 A1* | 3/2014 | Maxwell | | H01L 45/04 257/2 |
| 2014/0145135 A1* | 5/2014 | Gee | | H01L 45/085 257/2 |
| 2014/0213032 A1* | 7/2014 | Kai | | H01L 45/04 438/382 |
| 2014/0370696 A1* | 12/2014 | Tu | | H01L 21/3212 438/585 |
| 2015/0060750 A1 | 3/2015 | Sung et al. | | |
| 2015/0147864 A1 | 5/2015 | Liao et al. | | |
| 2015/0194601 A1* | 7/2015 | Sills | | H01L 45/06 257/4 |
| 2015/0228893 A1* | 8/2015 | Narayanan | | H01L 45/1233 257/4 |
| 2015/0340247 A1* | 11/2015 | Balakrishnan | | H01L 21/4817 257/2 |
| 2015/0340609 A1* | 11/2015 | Banno | | H01L 45/085 257/4 |
| 2016/0020104 A1* | 1/2016 | Lin | | H01L 21/28088 257/412 |
| 2016/0190208 A1* | 6/2016 | Nazarian | | G11C 13/003 257/5 |
| 2016/0225824 A1* | 8/2016 | Jo | | H01L 45/1233 |
| 2016/0248008 A1 | 8/2016 | Chen et al. | | |
| 2017/0092693 A1* | 3/2017 | Tan | | H01L 27/228 |
| 2017/0117467 A1* | 4/2017 | Chang | | H01L 27/24 |

OTHER PUBLICATIONS

Office Action dated Dec. 20, 2017 for U.S. Appl. No. 15/486,529, 17 pages.

Office Action dated Oct. 6, 2017 for U.S. Appl. No. 15/480,074, 24 pages.

Final Office Action received for U.S. Appl. No. 15/486,529, dated Apr. 27, 2018, 21 pages.

Final Office Action received for U.S. Appl. No. 15/480,074, dated May 31, 2018, 35 pages.

* cited by examiner

FLATNESS OF MEMORY CELL SURFACES

CROSS-REFERENCE TO RELATED APPLICATIONS

This application claims the benefit of U.S. Provisional Patent Application Ser. No. 62/335,783 filed on May 13, 2016 entitled, "IMPROVED FLATNESS OF MEMORY CELL SURFACES." The entirety of this application is incorporated herein by reference, for all purposes.

TECHNICAL FIELD

This disclosure generally relates to techniques for improving surface flatness of memory device surfaces such as, for example, increasing smoothness of a surface (e.g., variance from a plane and/or making the surface more planar) and/or decreasing variance or height differences between adjacent surfaces.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventor(s) believe that arrays of many such memory cells, can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventor(s) desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides for fabricating a two-terminal memory device. Fabrication can comprise forming a bottom electrode (BE) of the two-terminal memory device over a substrate. Overlying the BE and the substrate, a BE insulator layer can be formed. In some embodiments, a BE gapfill dielectric layer can be formed overlying the BE insulator layer. A first BE chemical-mechanical planarization (CMP) process (e.g., an oxide CMP) can be performed. The first BE CMP process can remove a first portion of the BE insulator layer overlying a top surface of the BE and remove a first portion of the BE. A second BE CMP process (e.g., a tungsten CMP) can be performed on the result of the first BE CMP. The second BE CMP process can remove a second portion of the BE insulator layer and a second portion of the BE, and can expose top surfaces of the BE insulator layer having a first distance to the substrate and a top surface of the BE having a second distance to the substrate. The difference between the first distance and the second distance can be less than two nanometers.

In other words, adjacent surfaces (e.g., a top surface of the BE insulator layer and a top surface of the BE) can be substantially flush and/or have very little variance, which the inventors believe can provide certain benefits. In some embodiments, a height/thickness variance of the BE over the entire top surface of the BE can vary by less than about two nanometers, which can also provide benefits.

The fabricating can further comprise forming a switching layer overlying the BE and the BE insulator layer and forming a top electrode (TE) overlying the switching layer. The TE and switching layer can be patterned to remove portions of the TE and the switching layer overlying insulator material (e.g., portions overlying some of the BE insulator layer or in other embodiments portions overlying some of the BE gapfill dielectric layer.

A first TE CMP process (e.g., an oxide CMP) can be performed. The first TE CMP process can remove a first portion of the TE insulator layer overlying a top surface of the TE and remove a first portion of the TE. A second BE CMP process (e.g., a tungsten CMP) can be performed on the result of the first TE CMP. The second TE CMP process can remove a second portion of the TE insulator layer and a second portion of the TE, and can expose top surfaces of the TE insulator layer having a first distance to the insulator layer and a top surface of the TE having a second distance to the BE. The difference between the first distance and the second distance can be less than two nanometers The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
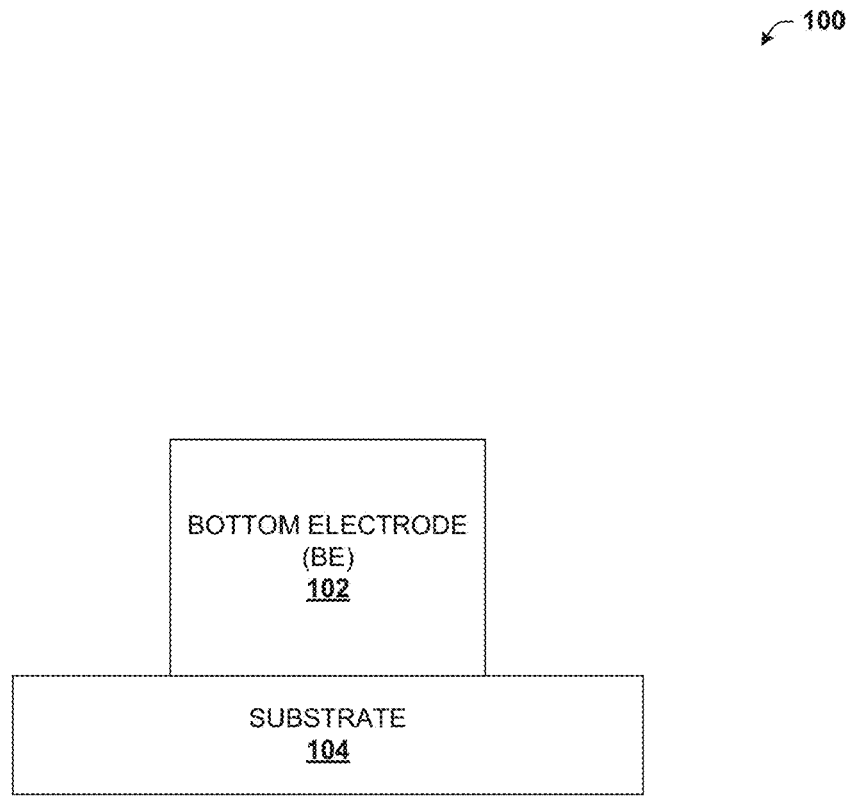
FIG. 1 illustrates a block diagram of an example integrated circuit device depicting forming of a BE in connection with improving memory cell surface flatness in accordance with certain embodiments of this disclosure.

This disclosure relates to two-terminal memory cells employed for digital or multi-level information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts (e.g., electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

Embodiments of the subject disclosure can provide a filamentary-based memory cell. In some embodiments, the filamentary-based memory cell includes a non-volatile memory device, whereas other embodiments provide a volatile selector device in electrical series with the non-volatile memory device. In further embodiments, both the volatile selector device and the non-volatile memory device can be filamentary-based devices, though the subject disclosure is not limited to these embodiments.

One example of a filamentary-based device can comprise: one or more conductive layers (e.g., comprising, e.g., TiN, TaN, TiW, metal compounds), an optional interface layer (e.g., doped p-type (or n-type) silicon (Si) bearing layer (e.g., p-type or n-type polysilicon, p-type or n-type polycrystalline SiGe, etc., or a combination of the foregoing)), a resistive switching layer (RSL) and an active metal layer capable of being ionized. Under suitable conditions, the active metal layer can provide filament forming ions to the RSL. In such embodiments, a conductive filament (e.g., formed by the ions) can facilitate electrical conductivity through at least a subset of the RSL, and a resistance of the filament-based device can be determined by a tunneling resistance (or, e.g., ohmic contact resistance) between the filament and the conductive layer. To reverse electrical conductivity resulting from the conductive filament, whether for the volatile selector device or the non-volatile memory device (with the exception of one-time programmable memory devices), the filament can be deformed. In some embodiments, deformation of the filament can comprise the particles (e.g., metal ions)—trapped within the defect locations—becoming neutral particles (e.g., metal atoms) in absence of the bias condition that have a high electrical resistance. In other embodiments, deformation of the filament can comprise dispersion (or partial dispersion) of the particles within the RSL, breaking a conductive electrical path provided by the filament in response to the bias condition. In still other embodiments, deformation of the filament can be in response to another suitable physical mechanism, or a suitable combination of the foregoing.

Generally, deformation of a conductive filament results from a change in the bias conditions to a second set of bias conditions. The second set of bias conditions can vary for different devices. For instance, deformation of a conductive filament formed within the volatile selector device can be implemented by reducing an applied bias below a formation magnitude (or small range of magnitudes, such as a few tens of a volt) associated with filament formation within the volatile selector device. Depending on the embodiment, a conductive filament can be created within a volatile selector device in response to a positive bias (e.g., forward bias) or in response to a negative bias (e.g., reverse bias), and deformation of the filament can occur in response to a suitable lower-magnitude positive bias or a suitable lower-magnitude negative bias, respectively. See U.S. patent application Ser. No. 14/588,185 filed Dec. 31, 2014 commonly owned by the assignee of the present application, and incorporated by reference herein in its entirety and for all purposes. In contrast, deformation of a conductive filament formed within the non-volatile memory device can be implemented by providing a suitable erase bias (e.g., a reverse bias), having opposite polarity from a program bias (e.g., forward bias) utilized to form the conductive filament within the non-volatile memory device.

In various embodiments of a memory cell of the present disclosure, a conductive layer may include a metal, a doped semiconductor, titanium, titanium nitride (TiN), tantalum nitride (TaN), tungsten (W) or other suitable electrical conductor. The RSL (which can also be referred to in the art as a resistive switching media (RSM)) can comprise, e.g., an undoped amorphous Si layer, a semiconductor layer having intrinsic characteristics, a silicon nitride (e.g. SiN, Si3N4, SiNx where x is a suitable positive number, etc.), a Si sub-oxide (e.g., SiOy wherein y has a value between 0.1 and 2), a Si sub-nitride (e.g., SiNy wherein y has a value between 0.1 and 2), an Al sub-oxide, an Al sub-nitride, and so forth. Other examples of materials suitable for the RSL could include $Si_XGe_YO_Z$ (where X, Y and Z are respective suitable positive numbers), a silicon oxide (e.g., $SiO_N$, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) or other suitable oxides, a metal nitride (e.g., AlN, $AlN_F$ where F is a suitable positive number), a non-stoichiometric silicon compound, and so forth, or a suitable combination thereof. In various embodiments, the RSL includes a number of material voids or defects to trap or hold particles in place, in the absence of an external program stimulus causing the particles to drift within the RSL and form the conductive filament. For the non-volatile memory device then, the particles can remain trapped in the absence of the external program stimulus, requiring a suitable reverse bias (e.g., a negative polarity erase stimulus) to drive the particles out of the voids/defects, or otherwise break continuity of the conductive filament, thereby deforming the conductive filament.

The contact material layer can be comprised of any suitable conductor, such as a conductive metal, a suitably doped semiconductor, or the like. Where utilized, the contact material layer can be employed to provide good ohmic contact between the RSL and a metal wiring layer of an associated memory architecture. In some embodiments, the contact material layer can be removed and the RSL can be in physical contact with a metal wiring layer. Suitable metal wiring layers can include copper, aluminum, tungsten, platinum, gold, silver, or other suitable metals, suitable metal alloys, or combinations of the foregoing. In further embodiments, a diffusion mitigation layer or adhesion layer can be provided between the RSL and the metal wiring layer (or between the RSL and the contact material layer).

Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. In some embodiments, a thin layer of barrier material composed of Ti, TiN, or the like, may be disposed between the RSL and the active metal layer (e.g., Ag, Al, and so on). Details pertaining to additional embodiments of the subject disclosure similar to the foregoing example(s) can be found in the following U.S. patent applications that are licensed to the assignee of the present application for patent: application Ser. No. 11/875,541 filed Oct. 19, 2007, application Ser. No. 12/575,921 filed Oct. 8, 2009, and the others cited herein, each of which are incorporated by reference herein in their respective entireties and for all purposes.

In response to a suitable program stimulus (or set of stimuli) a conductive path or a filament of varying width and length can be formed within a relatively high resistive portion of a non-volatile memory device (e.g., the RSL). This causes a memory cell associated with the non-volatile memory device to switch from a relatively high resistive state, to one or more relatively low resistive states. In some resistive-switching devices, an erase process can be implemented to deform the conductive filament, at least in part, causing the memory cell to return to the high resistive state from the low resistive state(s), as mentioned previously. This change of state, in the context of memory, can be associated with respective states of a binary bit or multiple binary bits. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in respective memory cells.

According to various disclosed embodiments, disclosed resistive switching devices can be fabricated consistent with foundry compatible processes. As utilized herein, foundry compatible refers to consistency with physical constraints associated with fabrication of a semiconductor-based device in a commercial semiconductor fabrication foundry, such as Taiwan Semiconductor Manufacturing Corporation, among others. Physical constraints include a thermal budget (e.g., maximum operating temperature) of a die, and of materials and metals constructed on the die prior to a given process step. For example, where a die comprises one or more metal layers or constructs, and viability of device models require the metal layers to maintain tight position tolerance, the thermal budget may be set by the softening temperature of the metal(s) to avoid loss of metal rigidity. Other physical constraints can include, CMOS, nMOS or pMOS fabrication constraints, where suitable, fabrication toolset limitations of a particular metallization scheme (e.g., etching/masking/grooving toolsets available for Aluminum, Copper, etc.), physical properties requiring special process handling (e.g., dispersion properties of Cu, oxidation properties of metals, semi-conducting materials, etc.), or the like, or other constraints of commercial foundry. Accordingly, the phrase "foundry compatible" implies consistency with process limitations of at least one commercial semiconductor fabrication foundry.

Thermal budget refers to an amount of thermal energy transferred to a wafer during a particular temperature operation. During the process of manufacturing the resistive memory, for example, there is a desire to not adversely affect complementary metal oxide semiconductor (CMOS) devices by application of excess heat, or the like. Accordingly, CMOS devices within a substrate can impose a thermal budget constraint to the manufacture of memory components upon a CMOS chip or substrate (e.g., by way of a backend of line fabrication process). Likewise, thermal budget constraints should be considered during the manufacture of a resistive memory device in an integrated circuit, for instance.

An integrated circuit (IC) foundry includes various equipment and processes that are leveraged in order to incorporate the resistive memory into the backend of line process. The inventors of the present disclosure are familiar with backend material compatibility issues associated there with. The one or more disclosed aspects can perform the process of fabricating the resistive memory device in a relatively simple manner compared to other resistive memory fabrication processes. For example, a common material(s), or common process step(s) can be employed in fabricating differently configured memory arrays (e.g., 1T1R, 1TnR) disclosed herein.

Further, one or more disclosed aspects can enable smaller die sizes and lower costs through one or more disclosed processes for monolithic integration of resistive memory onto a product of a frontend of line process (e.g., e.g., a MOS substrate, including CMOS, nMOS, or pMOS devices). Further, the fabrication of the resistive memory devices may be performed using standard IC foundry-compatible fabrication processes. Various embodiments can also be implemented without design changes after monolithic integration (e.g., over a CMOS device) to account for changes in parasitic structure. A parasitic structure is a portion of the device (e.g., memory device) that resembles in structure a different semiconductor device, which might cause the device to enter an unintended mode of operation. Further, in at least one disclosed embodiment, there is provided a product (e.g., a memory device) of a fabrication process that can comprise monolithic integration of resistive memory over a CMOS circuitry. Further, the fabrication process can comprise IC foundry-compatible processes in a further embodiment (e.g., new or different processes are not necessary, though in alternative embodiments future improvements to such processes should not be excluded from the scope of various aspects of the present disclosure). In addition, the disclosed aspects can be performed within a thermal budget of frontend of line devices.

In some embodiments, the active metal layer can comprise a metal nitride selected from the group consisting of: $TiN_x$, $TaN_x$, $AlN_x$, $CuN_x$, $WN_x$ and $AgN_x$, where x is a positive number. In other embodiments, the active metal layer can comprise a metal oxide selected from the group consisting of: $TiO_x$, $TaO_x$, $AlO_x$, $CuO_x$, $WO_x$ and $AgO_x$. In other embodiments, the active metal layer can comprise a metal oxi-nitride selected from the group consisting of: $TiO_aN_b$, $AlO_aN_b$, $CuO_aN_b$, $WO_aN_b$ and $AgO_aN_b$, where a and b are positive numbers. In some embodiments, the switching layer can comprise a material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiN_y$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers, and y is larger than x. Various combinations of the above are envisioned and contemplated within the scope of embodiments of the present invention.

In an embodiment, the active metal layer can comprise a metal nitride: $MN_x$, e.g. AgNx, TiNx, AlNx, and the switching layer can comprise a metal nitride: $MN_y$, e.g. AgNy, TiNy, AlNy, where y and x are positive numbers, and in some cases y is larger than x. In another embodiment, the active metal layer can comprise a metal oxide: $MO_x$, e.g. AgOx, TiOx, AlOx, and the switching layer can comprise a metal oxide: $MO_y$, e.g. AgOy, TiOy, AlOy, where y and x are positive numbers, and in some cases y is larger than x. In still other embodiments, the metal compound of the active metal layer is selected from a first group consisting of: $MN_x$ (e.g., $AgN_x$, $TiN_x$, $AlN_x$), and the switching layer comprises $MO_y$, (e.g. $AgO_x$, $TiO_x$, $AlO_x$) or $SiO_y$, where x and y are typically non-stoichiometric values.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

FIGS. 1-7B generally relate to fabrication of a two-terminal memory device. Such fabrication is logically organized into two sections for convenience and to better imparts the disclosed concepts. For example, fabrication is organized herein as a first part, relating to fabrication of a bottom electrode (BE) and adjacent or associated elements, which is detailed in connection with FIGS. 1-4; and a second part, relating to fabrication of a top electrode (TE) and adjacent or associated elements, which is detailed in connection with FIGS. 5A-7B. In some embodiments, certain techniques, processes, or advantages detailed in the first part can be substantially similar to those of the second part and vice versa. Hence, what is described in connection with the BE section may in some embodiments be applicable to the TE section and vice versa.

Referring initially to FIG. 1, integrated circuit device 100 is depicted that illustrates forming a BE in connection with improving memory cell surface flatness. In this example, BE 102 is formed overlying a substrate 104. In some embodiments, BE 102 can comprise at least one material selected from a group consisting of: TiN, TaN, and W. In some embodiments, a height of BE 102 can be in a range of between about 10 nanometers (nm) to about 200 nm.

Figure 2A:
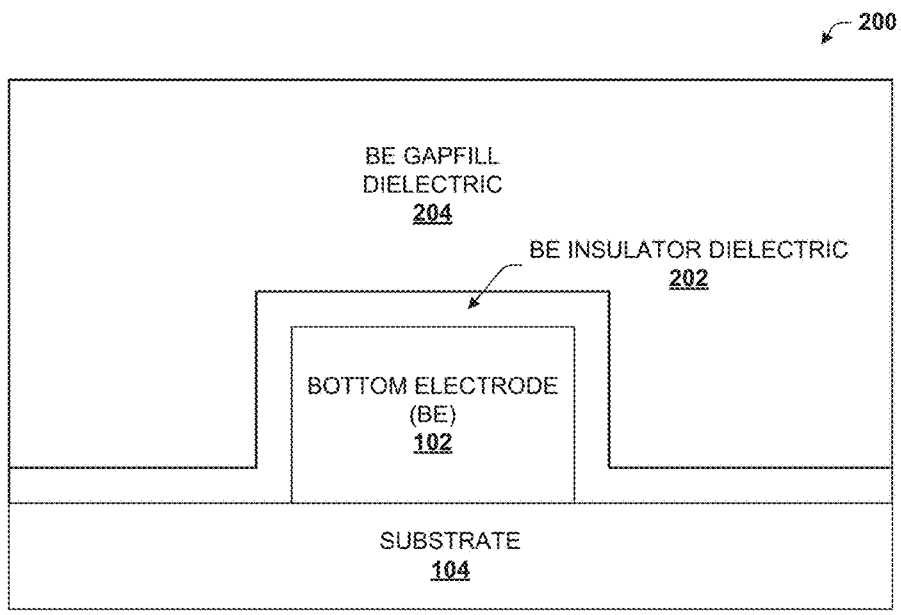
FIG. 2A illustrates an example integrated circuit device that depicts overlying the BE with a BE insulator dielectric layer and a BE gapfill dielectric layer in accordance with certain embodiments of this disclosure.
Figure 2B:
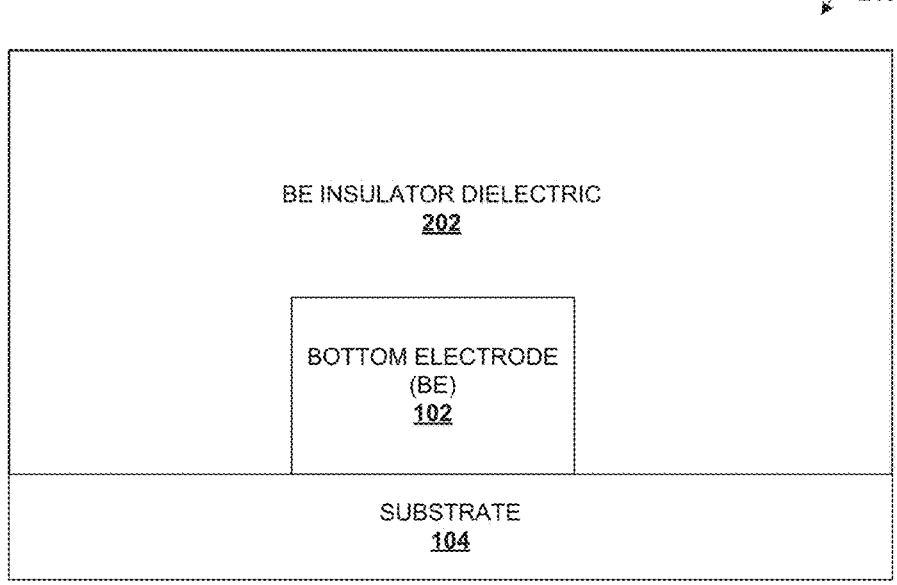
FIG. 2B illustrates an example integrated circuit device illustrating an embodiment without the BE gapfill dielectric layer in accordance with certain embodiments of this disclosure.

Turning now to FIGS. 2A and 2B, two example embodiments are provided. FIG. 2A depicts integrated circuit device 200 that illustrates overlying the BE with a BE insulator dielectric layer and a BE gapfill dielectric layer. For example, BE insulator layer 202 can be formed, overlying BE 102. Thus, BE insulator layer 202 encloses BE 102, both on a top surface of BE 102 and side surfaces of BE 102. In some embodiments, BE insulator layer 202 can have a thickness in a range of between about three nm to about seven nm. This thickness can be substantially constant for the portions overlying BE 102 (e.g., a vertical thickness) and the portions adjacent to sidewalls of BE 102 (e.g., a horizontal thickness).

BE gapfill dielectric layer 204 can be formed overlying BE insulator layer 202. In some embodiments, BE gapfill dielectric layer 204 can comprise at least one material selected from a group consisting of: a-Si, SiN, a-SiC, and nitrogen doped a-SiC, $SiO_2$, FSG, and other low-k dielectrics. In some embodiments, BE gapfill dielectric layer 204 can have a thickness in a range of between about ten nm to about 300 nm. In some embodiments, BE gapfill dielectric layer 204 can have a thickness selected to provide a sufficient fill for a chemical-mechanical planarization (CMP) process. BE gapfill dielectric layer 204 can be substantially non-conductive.

FIG. 2B depicts integrated circuit device 210 illustrating an embodiment without the BE gapfill dielectric layer. In this embodiment, BE insulator layer 202 further serves the role as the BE gapfill dielectric, so BE gapfill dielectric layer 204 is not used. Such embodiments can be employed, e.g., when BE insulator layer 202 has a sufficiently high resistivity, such as greater than about 20 mega-Ohms-cm and sufficient gapfill capability for the CMP processes detailed herein or similar.

As is detailed herein, integrated circuit device 200 or 210 can be exposed to a two CMP processes is sequence. In some embodiments, BE insulator layer 202 can comprise a material selected based on one or more a desired property(ies), one or two of which can be resistivity or gapfill capabilities noted above. Various other properties are further detailed in connection with the two CMP processes detailed at FIGS. 3 and 4.

Figure 3:
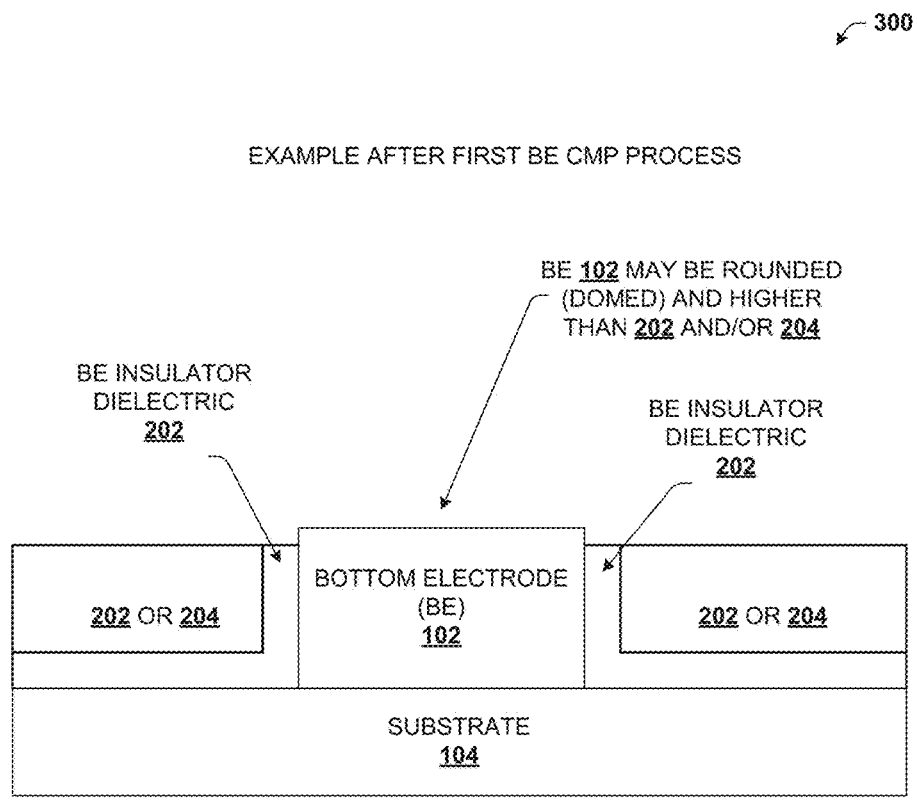
FIG. 3 depicts an example integrated circuit device illustrating an example after a first (BE) CMP process is performed in accordance with certain embodiments of this disclosure.

Turning now to FIG. 3, integrated circuit device 300 is depicted. Integrated circuit device 300 illustrates an example after a first (BE) CMP process is performed. The first CMP process can remove a first portion of the BE insulator layer 202 overlying a top surface of BE 102 and can remove some of BE 102. After the first CMP process, BE insulator layer 202 can be substantially planar. In embodiments where BE gapfill dielectric layer 204 is employed (e.g., integrated circuit device 200 as opposed to integrated circuit device 210), BE gapfill dielectric layer 204 can be substantially planar and have top surfaces that are substantially flush with the adjacent top surfaces of BE insulator layer 202. In some embodiments, the first CMP process can remove about ten nm to about 100 nm of BE 102.

The first CMP process can be an oxide CMP that is more effective at removing oxides than metals. As a result, BE 102 may be rounded or domed and may be higher than BE insulator layer 202 and/or BE gapfill dielectric layer 204 (e.g., protrudes from the plane representing top surfaces of 202 and/or 204. The inventors have identified certain difficulties that result when BE 102 is higher than the insulator dielectric layers (e.g., 202 or 204) as is depicted in FIG. 3. For example, when BE 102 is more than about five nm higher than adjacent dielectric layers, such can cause a thinning of switching layer (not shown, but see FIG. 5A) at areas that do not directly overly the BE. For example, the switching layer will tend to be thinner near the sidewall edges of the BE. Such can lead, e.g., to higher cell leakage for the memory device in operation, to greater variations in program/erase signal magnitudes, and to a higher step coverage of a top electrode. Higher step coverage heights can result in potential cracks in the memory device or other issues.

Figure 4:
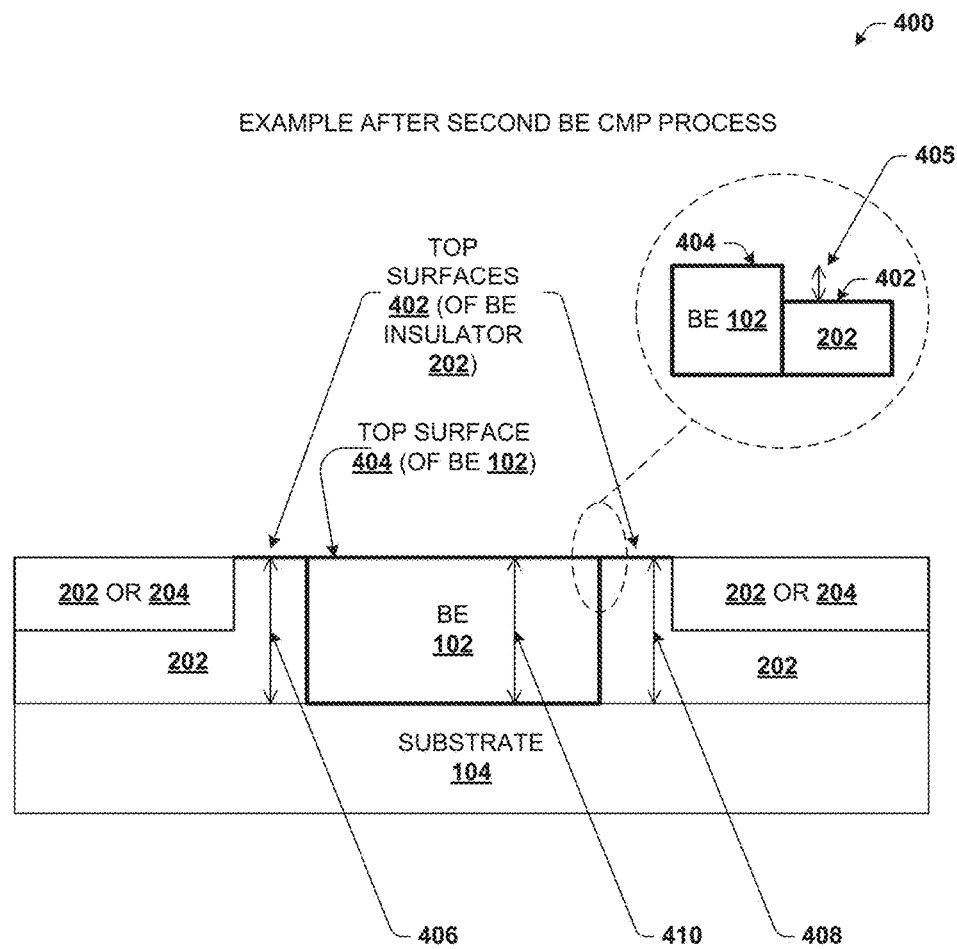
FIG. 4 depicts an example integrated circuit device illustrating an example after a second CMP process in accordance with certain embodiments of this disclosure.

In order to mitigate these or other difficulties, a second CMP process can be performed, which is illustrated at FIG. 4. FIG. 4 depicts integrated circuit device 400, illustrating an example after a second CMP process. The second CMP process can remove a second portion of the BE insulator layer 202 and a second portion of the BE 102. In some embodiments, the second CMP process removes a range of about 5 nm to about 30 nm of one or more of BE insulator layer 202, BE gapfill dielectric layer 204 (if present), and BE 102.

The second CMP process can be, e.g., a tungsten CMP or the like that is more effective at removing metals relative to oxides. Hence, the protruding portions of BE 102 can be removed and planarized. Such can expose top surfaces 402 representing top surfaces of BE insulator layer 202 and top surface 404 representing a top surface of BE 102. Top surface 404 can be substantially flush with adjacent top surfaces 402, as illustrated. The cutout that shows a close-up of the interface between top surface 404 and one of the top surfaces 402 show that surfaces 404 and 402 differ by a distance 405. In some embodiments, distance 405 is less than about two nm. It is understood that top surface 402 may be the same height as top surface 404 (e.g., distance 405 is very close to zero) or may be higher.

If substrate 104 is very flat and/or has a consistent thickness, another way of saying the above is a distance 410 (e.g., a distance from top surface 404 to substrate 104, which is also a thickness of BE 102) can differ from distances 406 or 408 (e.g., distances from top surfaces 402 to substrate 104) by no more than about two nanometers. In effect, BE 102 does not protrude from or protrudes very little above adjacent planes of dielectric material of top surfaces 402.

In some embodiments, top surface 404 (of BE 102) can be substantially 'smooth' or substantially planar. Such can be characterized as no two locations or areas of top surface 404 differing in height (e.g., distance to substrate 104) by more than about two nm.

Having a 'smooth' top surface 404 and/or a top surface 404 that is substantially flush with adjacent top surfaces 402 can provide a number of benefits, which can include the following as well as other benefits. Such can mitigate or eliminate switching layer thickness variations at the edges of BE 102. Such can provide better step coverage for the top electrode (e.g., no top electrode thinning at BE 102 edges—not shown, but see FIG. 7A or 7B). Having no or small gaps in the top electrode at the BE 102 edges can protect the switching layer from top electrode pattern cleans and subsequent deposition or other formation processes. Sidewalls of BE 102 can be protected from oxidization during formation/deposition of BE insulator layer 202 (and same for corresponding top electrode). Oxidization of switching layer can be mitigated during top electrode deposition/formation.

As was noted previously, BE insulator layer 202 can be selected based on certain desirable properties. For example, in some embodiments, BE insulator layer 202 can be selected based on a first property characterized as having a first removal rate ratio in a range of about 0.5:1 to about 4:1.

The first removal rate ratio can represent a ratio in response to the first CMP process of a first removal rate of the BE insulator layer 202 to a first removal rate of the BE 102. In some embodiments, BE insulator layer 202 can be selected based on a second property characterized as having a second removal rate ratio greater than about 5:1. The second removal rate ratio can represent a ratio in response to the second CMP process of a second removal rate of the BE 102 to a second removal rate of the BE insulator layer 202 and/or BE gapfill dielectric layer 204.

In some embodiments, BE insulator layer 202 can be selected based on a third property characterized as mitigating oxidization to the BE 102 or a switching layer (e.g., switching layer 502 of subsequent figures) during fabrication. In some embodiments, BE insulator layer 202 can be selected based on a fourth property characterized as having an oxygen content that is less than about two percent. In some embodiments, BE insulator layer 202 can be selected based on a fifth property characterized as preventing, during operation of the two-terminal memory device, an electrical conduction path. In some embodiments, BE insulator layer 202 can be selected based on a sixth property characterized as non-interaction with the switching layer or preventing changes to electrical characteristics of the switching layer during fabrication or operation.

In some embodiments, BE insulator layer 202 can comprise SiN. In some embodiments, BE insulator layer 202 can comprise at least one material selected from a group consisting of: a-Si, SiN, a-SiC, and nitrogen doped a-SiC.

Figure 5A:
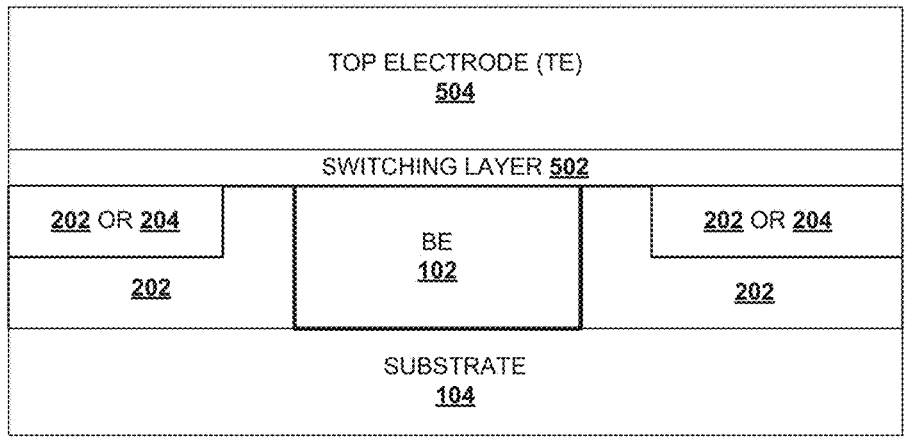
FIG. 5A depicts an example integrated circuit device with a switching layer and a top electrode in accordance with certain embodiments of this disclosure.

Turning now to FIG. 5A, integrated circuit device 500 is depicted. Integrated circuit device 500 illustrating formation of a switching layer and a top electrode. For example, switching layer 502 can be formed overlying integrated circuit device 400 or a system or integrated circuit device that is substantially similar to integrated circuit device 400. In that regard, in the depicted embodiment, switching layer 502 is formed overlying integrated circuit device 400, although it should be understood that switching layer 502 and/or top electrode 502 can be formed overlying substantially any suitable bottom electrode that is formed according to any suitable or compatible technique. For example, in some embodiments, BE 102 can be formed by employing a via technique, such as that disclosed in U.S. patent application Ser. No. 14/636,363 filed Mar. 3, 2015 commonly owned by the assignee of the present application, and incorporated by reference herein in its entirety and for all purposes. For instance, such can be accomplished by forming BE insulator layer 202 and/or BE gapfill dielectric layer 204 upon substrate 104 and constructing (e.g., etching) a via therein. Within said via, BE 102 can be deposited or otherwise formed and in some embodiments planarized, for example, by performing a suitable CMP process.

Regardless of how BE 102 (and other bottom portions) is formed for integrated circuit device 500, switching layer 502 can be formed overlying BE 102 and the BE insulator layer 202. In embodiments in which BE gapfill dielectric layer 204 is used and as shown in this example, switching layer 502 can be formed overlying BE gapfill dielectric layer 204. In some embodiments, switching layer 502 can have a thickness in a range of about one nanometer to about seven nanometers. In some embodiments, the thickness of the switching layer is approximately constant characterized as being approximately a same thickness at a first location overlying a central portion of the BE 102, a second location overlying a left edge of the BE 102, and a third location overlying a right edge of the BE 102.

In some embodiments, TE 504 may be formed overlying switching layer 502. In some embodiments, TE 504 can be comprise one or more materials and/or have one or more material layers. For example, TE 504 can comprise an active metal layer as detailed herein. In some embodiments, TE 504 can comprise the active metal layer and a barrier material layer.

Figure 5B:
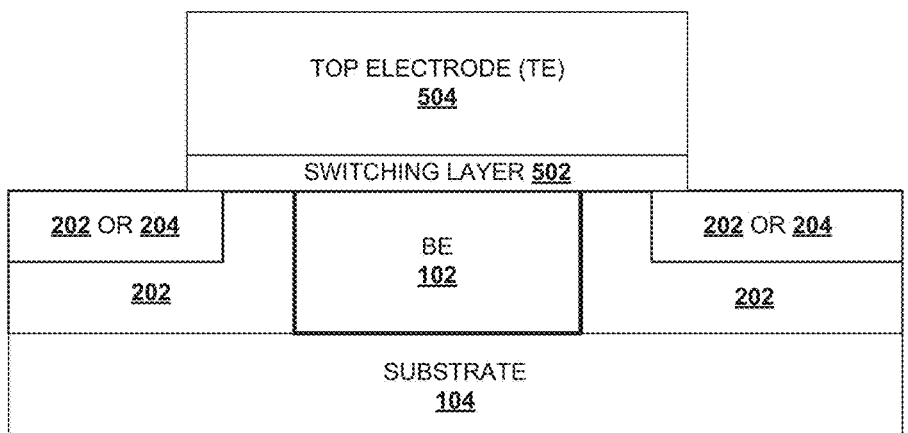
FIG. 5B depicts an example integrated circuit device after patterning and etching the top electrode and the switching layer in accordance with certain embodiments of this disclosure.

FIG. 5B depicts integrated circuit device 510. Integrated circuit device 510 illustrates an example after patterning and etching the top electrode and the switching layer. As illustrated, TE 504 (and switching layer 502) can be wider than BE 102. Such is referred to herein as a pillar (BE 102) and collar (TE 504) configuration. In some embodiments, TE 504 can be wider than BE 102 by a range of less than about one nm to about 100 nm. In some embodiments, TE 504 can be have a same or lesser width than BE 102. In some embodiments, TE 504 can have a height in a range of about ten nm to about 200 nm.

Figure 6:
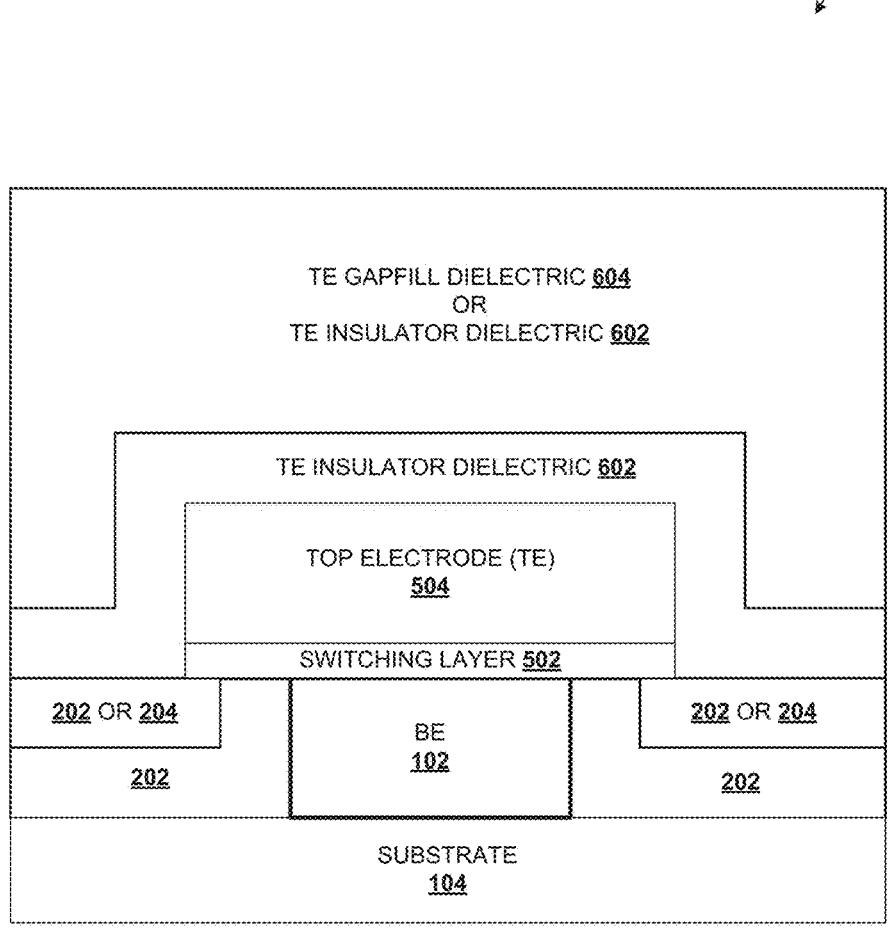
FIG. 6 depicts an example integrated circuit device that depicts formation of dielectric material overlying the TE in accordance with certain embodiments of this disclosure.

FIG. 6 depicts integrated circuit device 600. Integrated circuit device 600 illustrates formation of dielectrics overlying the TE. For example, TE insulator dielectric 602 can be formed overlying TE 504 and BE gapfill dielectric layer 204. In other embodiments (not shown), TE insulator layer 602 can be formed overlying TE 504 and BE insulator layer 202. In some embodiments, TE gapfill dielectric layer 604 can be formed overlying TE insulator layer 602.

Figure 7A:
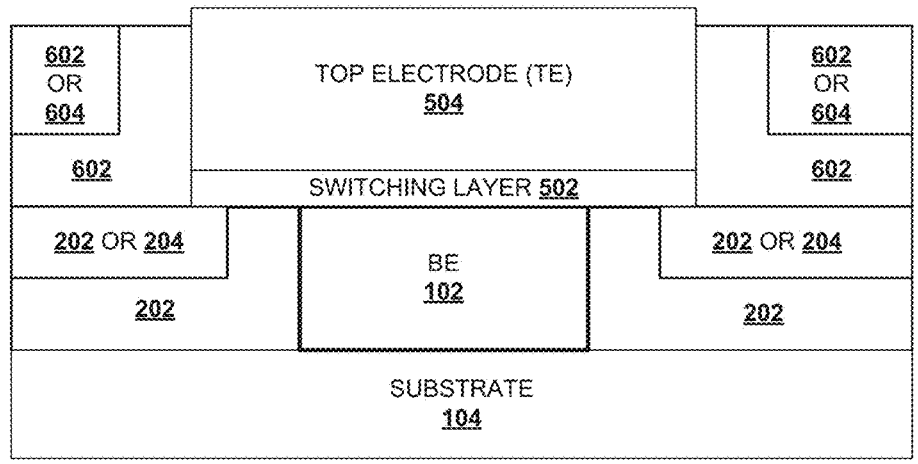
FIG. 7A depicts an example integrated circuit device after performing a first TE CMP process in accordance with certain embodiments of this disclosure.

FIG. 7A depicts integrated circuit device 700. Integrated circuit device 700 represents an example after performing a first TE CMP process. The first TE CMP process can be substantially similar to the first BE CMP process detailed in connection with FIG. 3. Hence, TE 504 can protrude slightly following first TE CMP process.

Figure 7B:
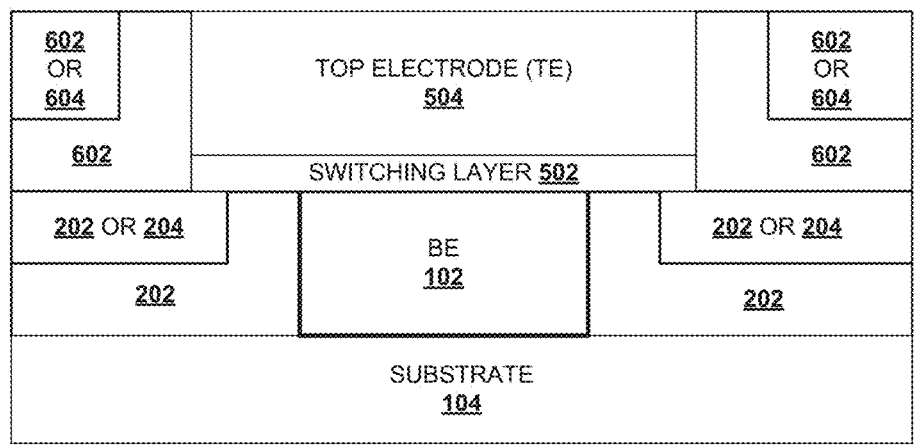
FIG. 7B illustrates an example integrated circuit device after performing a second TE CMP process in accordance with certain embodiments of this disclosure.

FIG. 7B depicts integrated circuit device 710. Integrated circuit device 710 represents an example after performing a second TE CMP process. The second TE CMP process can be substantially similar to the second BE CMP process detailed in connection with FIG. 4. Hence, TE 504 can be both 'smooth' and flush with respect to adjacent surfaces such as top surfaces of TE insulator layer 602 and/or top surfaces of TE gapfill dielectric layer 604.

In view of the exemplary diagrams described supra, process methods that can be implemented in accordance with the disclosed subject matter will be better appreciated with reference to the flow charts of FIGS. 8-11. While for purposes of simplicity of explanation, the methods of FIGS. 8-11 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 8:
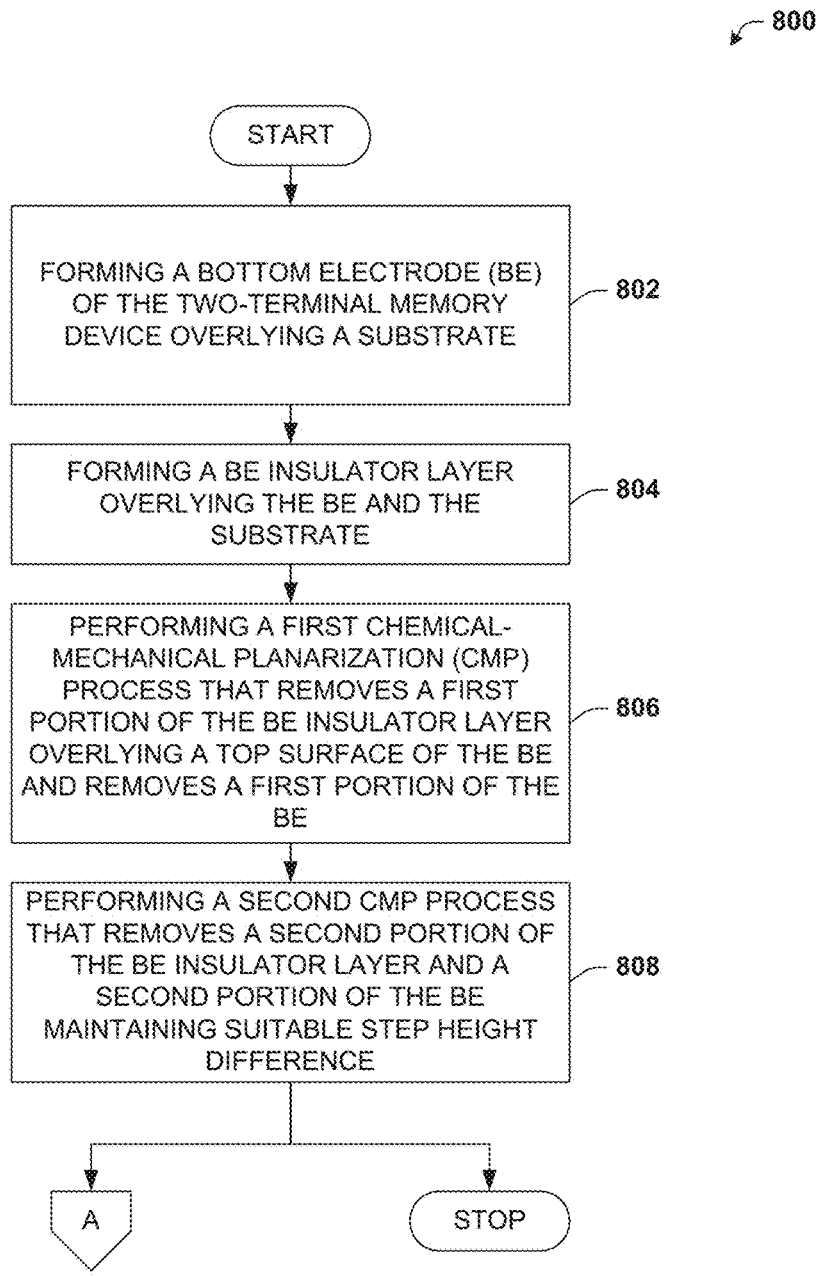
FIG. 8 illustrates an example methodology that can provide for fabrication of a first portion of a two-terminal memory device having a reduced step height difference between elements in accordance with certain embodiments of this disclosure.

Referring now to FIG. 8, exemplary method 800 is illustrated. Method 800 can provide for fabrication of a first portion of a two-terminal memory device having a reduced step height difference between elements. For example, at reference numeral 802, a two-terminal memory fabrication device can form a bottom electrode (BE). The BE can be formed overlying a substrate. In some embodiments, the BE can comprise one or more of TiN, TaN, and W.

At reference numeral 804, the fabrication device can form a BE insulator layer overlying the BE and the substrate. In some embodiments, the BE insulator layer can comprise a dielectric material. In some embodiments, the BE insulator layer can comprise one or more of a-Si, SiN, a-SiC, and nitrogen doped a-SiC.

At reference numeral 806, the fabrication device can perform a first chemical-mechanical planarization (CMP) process that removes a first portion of the BE insulator layer overlying a top surface of the BE. The first CMP process can further remove a first portion of the BE. In some embodiments, the first CMP process can be an oxide CMP that can be more effective at removing oxides than at removing metals.

At reference numeral 808, the fabrication device can perform a second CMP process that removes a second portion of the BE insulator layer. In some embodiments, the second CMP can be a tungsten CMP or similar that can be more effective at removing metals than at removing oxides. The second CMP process can further remove a second portion of the BE. The second CMP process exposes a top surface of the BE and top surfaces of the BE insulator layer on either side of the BE. Based on the techniques detailed herein, a step height between the top surfaces of the BE insulator layer and the BE can be less than about two nanometers. Method 800 can end or proceed to insert A, which is further detailed in connection with FIG. 9.

Figure 9:
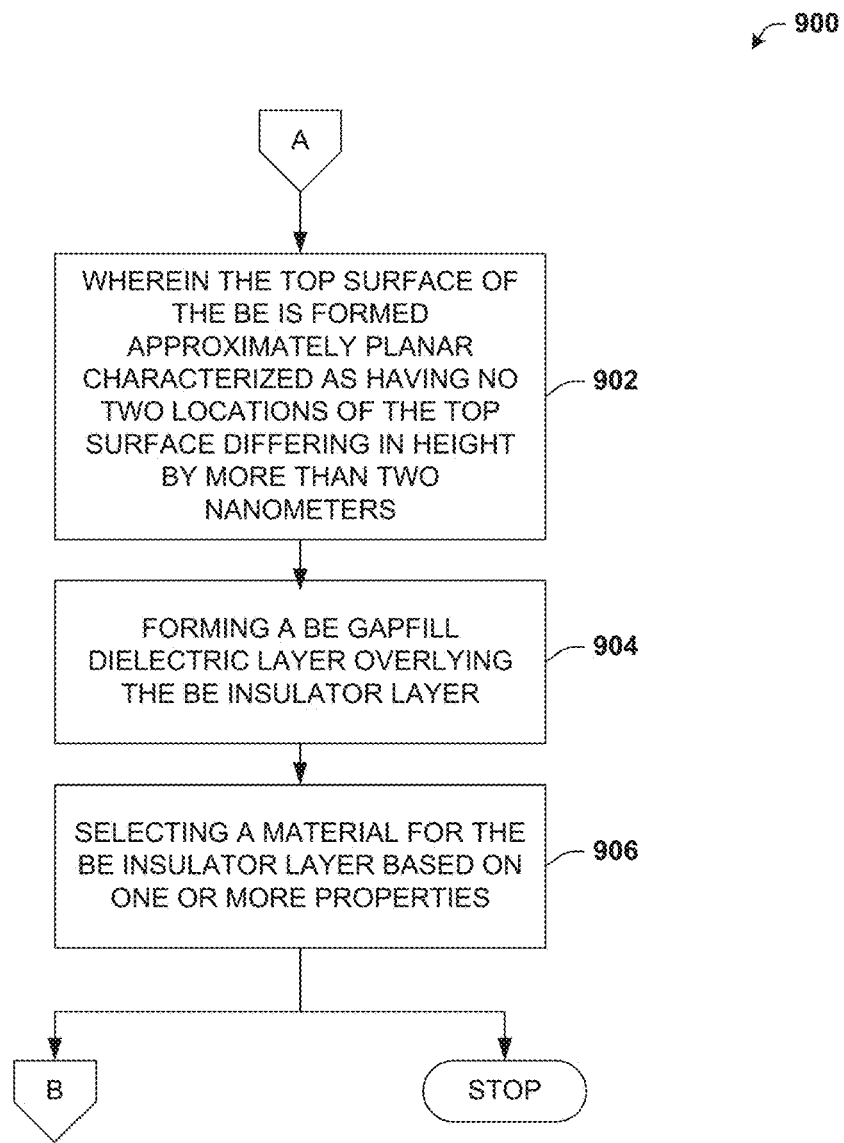
FIG. 9 illustrates an example methodology that can provide for additional elements or aspects in connection with fabrication of the first portion of the two-terminal memory device having a reduced step height difference between elements in accordance with certain embodiments of this disclosure.

Turning now to FIG. 9, exemplary method 900 is illustrated. Method 900 can provide for additional elements or aspects in connection with fabrication of the first portion of the two-terminal memory device having a reduced step height difference between elements. At reference numeral 902, the fabrication device can form or ensure the top surface of the BE (e.g., in connection with reference numeral 808 of FIG. 8) is approximately planar, which can be characterized as having no two locations of the top surface differing in height by more than about two nanometers.

At reference numeral 904, the fabrication device can form a BE gapfill dielectric layer. The BE gapfill dielectric layer can be formed overlying the BE insulator layer. The BE gapfill dielectric layer can be formed prior to performing the first and second CMP processes detailed in connection with reference numerals 806 and 808, respectively. For example, the BE gapfill dielectric layer can be formed when it is preferred to use a gapfill material instead of forming entirely out of the material of the BE insulator layer. In some embodiments, the BE gapfill dielectric layer can comprise one or more of a-Si, SiN, a-SiC, and nitrogen doped a-SiC, $SiO_2$, FSG, or other low-k dielectrics.

At reference numeral 906, the fabrication device can form the BE insulator layer comprising a material that is selected based on one or more properties. In some embodiments, the material can be selected based one or more properties relating to removal rates in connection with the first CMP process or the second CMP process. Such can be significant, as the first CMP process or the second CMP process can vary in type and be more or less effective at removing oxides versus metals, as detailed herein. Additionally or alternatively, the material can be selected based on one or more other properties apart from removal rate. For example, properties by which the material can be selected can relate to mitigating oxidization, oxygen content, low conductivity, being inert or non-interactive with respect to a resistive switching medium, and so forth. Method 900 can end or proceed to insert B, which is further detailed with reference to FIG. 10.

Figure 10:
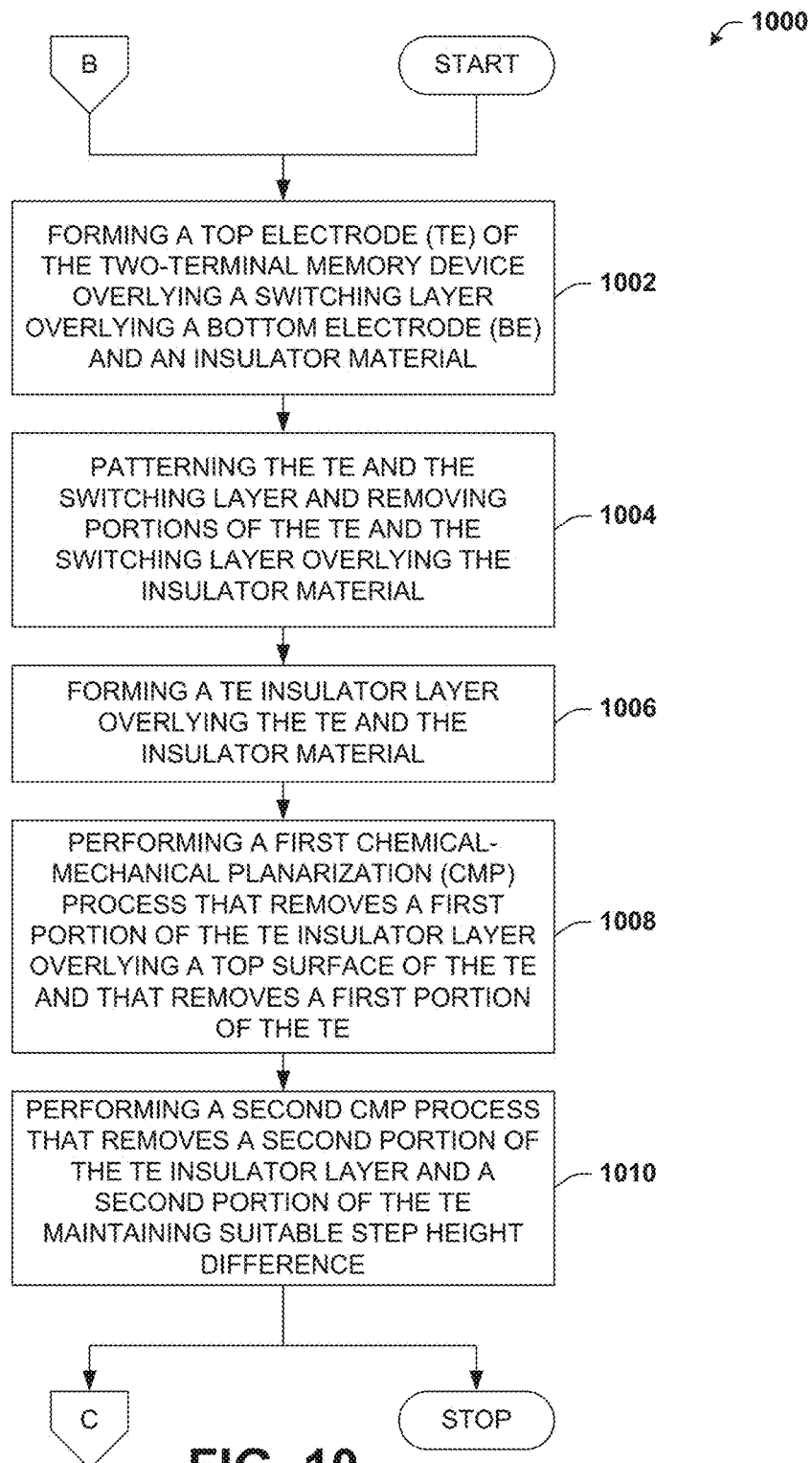
FIG. 10 illustrates an example methodology that can provide for fabrication of a second portion of a two-terminal memory device having a reduced step height difference between elements in accordance with certain embodiments of this disclosure.

Referring now to FIG. 10, exemplary method 1000 is illustrated. Method 1000 can provide for fabrication of a second portion of a two-terminal memory device having a reduced step height difference between elements. For example, at reference numeral 1002, the two-terminal memory fabrication device can form a top electrode (TE). The TE can be formed overlying a switching layer such as a resistive switching medium or the like. In some embodiments, the switching layer can overlie a bottom electrode and an insulator material. For example, the switching layer can be formed over the BE formed at reference numeral 802 and the insulator material can be the BE insulator layer formed at reference numeral 804 and/or the BE gapfill dielectric layer formed at reference numeral 904.

At reference numeral 1004, the fabrication device can pattern the TE and the switching layer. For example, the fabrication device can etch or otherwise remove portions of the TE and the switching layer overlying the insulator material. In some embodiments, the TE can have a width greater than a width of the BE (e.g., a pillar and collar configuration). In some embodiments, the switching layer can have a width that is greater than the width of the BE.

At reference numeral 1006, the fabrication device can form a TE insulator layer overlying the TE and the insulator material. In some embodiments, the TE insulator layer can comprise one or more of a-Si, SiN, a-SiC, and nitrogen doped a-SiC.

At reference numeral 1008, the fabrication device can perform a first CMP process that removes a first portion of the TE insulator layer overlying a top surface of the TE. The first CMP process can further remove a first portion of the TE. In some embodiments, the first CMP process can be an oxide CMP that can be more effective at removing oxides than at removing metals.

At reference numeral 1010, the fabrication device can perform a second CMP process that removes a second portion of the TE insulator layer. In some embodiments, the second CMP can be a tungsten CMP or similar that can be more effective at removing metals than at removing oxides. The second CMP process can further remove a second portion of the TE. The second CMP process exposes a top surface of the TE and top surfaces of the TE insulator layer on either side of the TE. Based on the techniques detailed herein, a step height between the top surfaces of the TE insulator layer and the TE can be less than about two nanometers. Method 1000 can end or proceed to insert C, which is further detailed in connection with FIG. 11.

Figure 11:
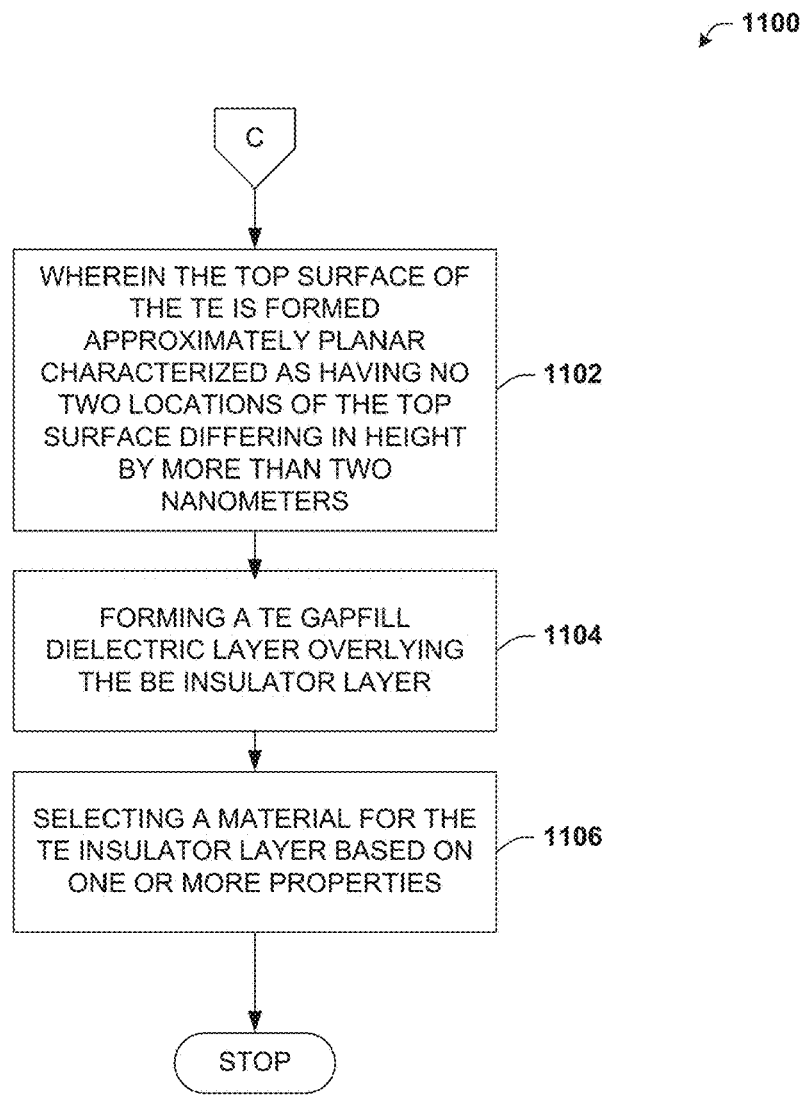
FIG. 11 illustrates an example methodology that can provide for additional elements or aspects in connection with fabrication of the second portion of the two-terminal memory device having a reduced step height difference between elements in accordance with certain embodiments of this disclosure.

Turning now to FIG. 11, exemplary method 1100 is illustrated. Method 1100 can provide for additional elements or aspects in connection with fabrication of the second portion of the two-terminal memory device having a reduced step height difference between elements. At reference numeral 1102, the fabrication device can form or ensure the top surface of the TE is approximately planar, which can be characterized as having no two locations of the top surface differing in height by more than about two nanometers.

At reference numeral 1104, the fabrication device can form a TE gapfill dielectric layer. The TE gapfill dielectric layer can be formed overlying the TE insulator layer. The TE gapfill dielectric layer can be formed prior to performing the first and second CMP processes detailed in connection with reference numerals 1008 and 1010, respectively. For example, the TE gapfill dielectric layer can be formed when it is preferred to use a gapfill material instead of forming entirely out of the material of the TE insulator layer. In some embodiments, the TE gapfill dielectric layer can comprise one or more of a-Si, SiN, a-SiC, and nitrogen doped a-SiC, $SiO_2$, FSG, or other low-k dielectrics.

At reference numeral 1106, the fabrication device can form the TE insulator layer comprising a material that is selected based on one or more properties. In some embodiments, the material can be selected based one or more properties relating to removal rates in connection with the first CMP process or the second CMP process. Such can be significant, as the first CMP process or the second CMP process can vary in type and be more or less effective at removing oxides versus metals, as detailed herein. Additionally or alternatively, the material can be selected based on one or more other properties apart from removal rate. For example, properties by which the material can be selected can relate to mitigating oxidization, oxygen content, low conductivity, being inert or non-interactive with respect to a resistive switching medium, and so forth.

Example Operating Environments

Figure 12:
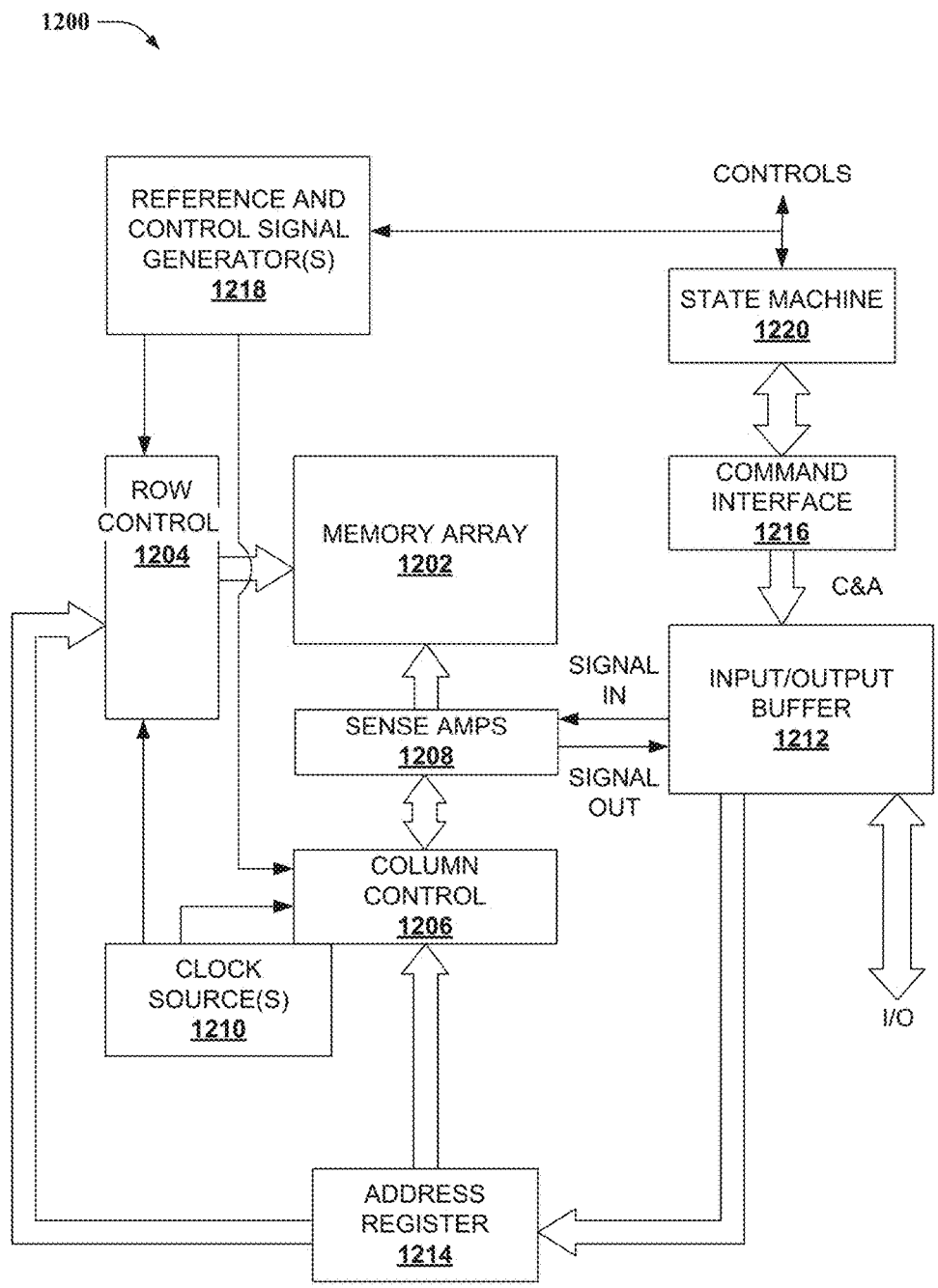
FIG. 12 illustrates a block diagram of an example electronic operating environment in accordance with certain embodiments of this disclosure.

FIG. 12 illustrates a block diagram of an example operating and control environment 1200 for a memory array 1202 of a memory cell array according to aspects of the subject disclosure. In at least one aspect of the subject disclosure, memory array 1202 can comprise memory selected from a variety of memory cell technologies. In at least one embodiment, memory array 1202 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing.

A column controller 1206 and sense amps 1208 can be formed adjacent to memory array 1202. Moreover, column controller 1206 can be configured to activate (or identify for activation) a subset of bit lines of memory array 1202. Column controller 1206 can utilize a control signal provided by a reference and control signal generator(s) 1218 to activate, as well as operate upon, respective ones of the subset of bitlines, applying suitable program, erase or read voltages to those bitlines. Non-activated bitlines can be kept at an inhibit voltage (also applied by reference and control signal generator(s) 1218), to mitigate or avoid bit-disturb effects on these non-activated bitlines.

In addition, operating and control environment 1200 can comprise a row controller 1204. Row controller 1204 can be formed adjacent to and electrically connected with word lines of memory array 1202. Also utilizing control signals of reference and control signal generator(s) 1218, row controller 1204 can select particular rows of memory cells with a suitable selection voltage. Moreover, row controller 1204 can facilitate program, erase or read operations by applying suitable voltages at selected word lines.

Sense amps 1208 can read data from, or write data to the activated memory cells of memory array 1202, which are selected by column control 1206 and row control 1204. Data read out from memory array 1202 can be provided to an input/output buffer 1212. Likewise, data to be written to memory array 1202 can be received from the input/output buffer 1212 and written to the activated memory cells of memory array 1202.

A clock source(s) 1208 can provide respective clock pulses to facilitate timing for read, write, and program operations of row controller 1204 and column controller 1206. Clock source(s) 1208 can further facilitate selection of word lines or bit lines in response to external or internal commands received by operating and control environment 1200. Input/output buffer 1212 can comprise a command and address input, as well as a bidirectional data input and output. Instructions are provided over the command and address input, and the data to be written to memory array 1202 as well as data read from memory array 1202 is conveyed on the bidirectional data input and output, facilitating connection to an external host apparatus, such as a computer or other processing device (not depicted, but see e.g., computer 1002 of FIG. 10, infra).

Input/output buffer 1212 can be configured to receive write data, receive an erase instruction, receive a status or maintenance instruction, output readout data, output status information, and receive address data and command data, as well as address data for respective instructions. Address data can be transferred to row controller 1204 and column controller 1206 by an address register 1210. In addition, input data is transmitted to memory array 1202 via signal input lines between sense amps 1208 and input/output buffer 1212, and output data is received from memory array 1202 via signal output lines from sense amps 1208 to input/output buffer 1212. Input data can be received from the host apparatus, and output data can be delivered to the host apparatus via the I/O bus.

Commands received from the host apparatus can be provided to a command interface 1216. Command interface 1216 can be configured to receive external control signals from the host apparatus, and determine whether data input to the input/output buffer 1612 is write data, a command, or an address. Input commands can be transferred to a state machine 1220.

State machine 1220 can be configured to manage programming and reprogramming of memory array 1202 (as well as other memory banks of a multi-bank memory array). Instructions provided to state machine 1220 are implemented according to control logic configurations, enabling state machine to manage read, write, erase, data input, data output, and other functionality associated with memory cell array 1202. In some aspects, state machine 1220 can send and receive acknowledgments and negative acknowledgments regarding successful receipt or execution of various commands. In further embodiments, state machine 1220 can decode and implement status-related commands, decode and implement configuration commands, and so on.

To implement read, write, erase, input, output, etc., functionality, state machine 1220 can control clock source(s) 1208 or reference and control signal generator(s) 1218. Control of clock source(s) 1208 can cause output pulses configured to facilitate row controller 1204 and column controller 1206 implementing the particular functionality. Output pulses can be transferred to selected bit lines by column controller 1206, for instance, or word lines by row controller 1204, for instance.

In connection with FIG. 13, the systems, devices, and/or processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 13:
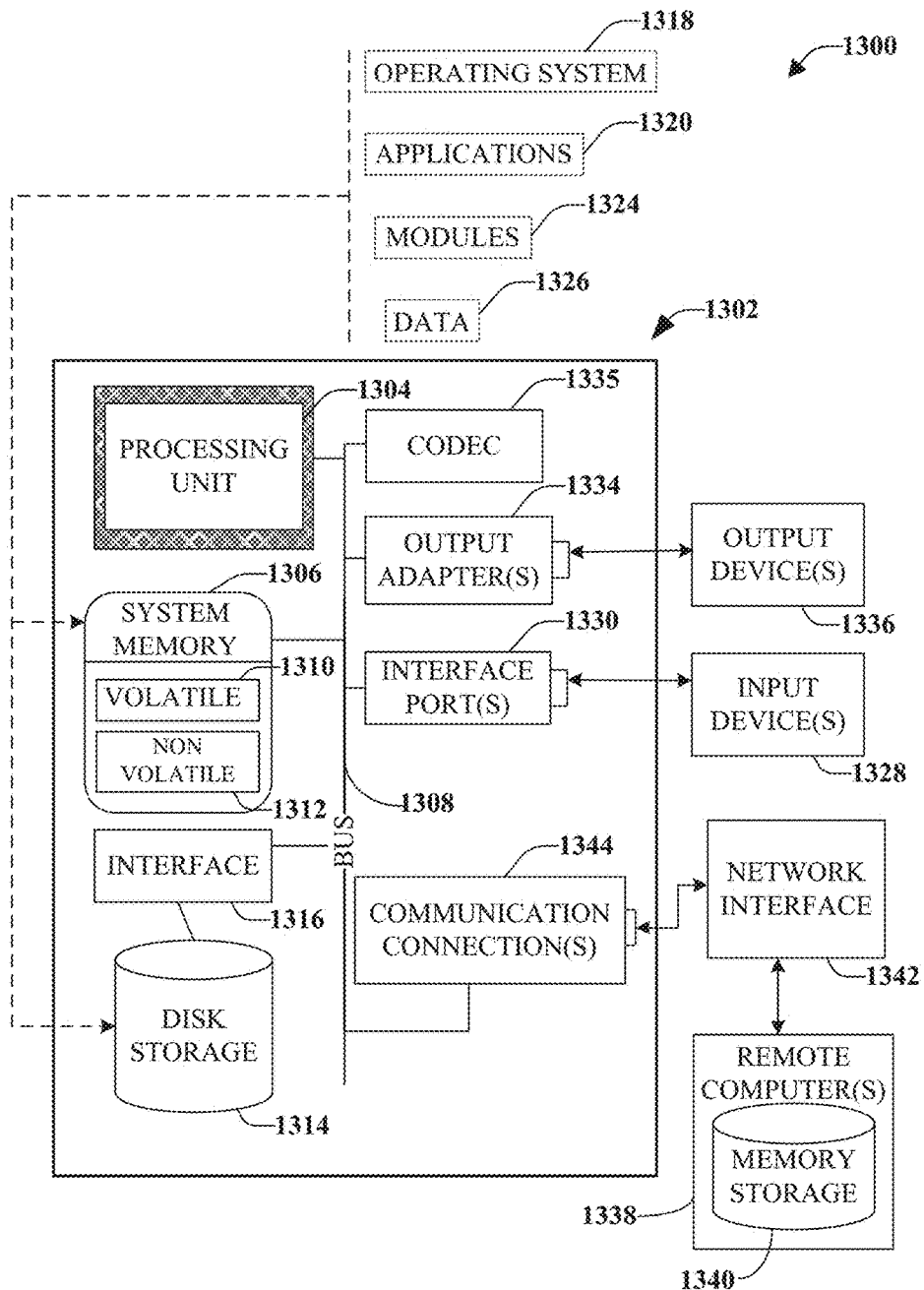
FIG. 13 illustrates a block diagram of an example computing environment in accordance with certain embodiments of this disclosure.

With reference to FIG. 13, a suitable environment 1300 for implementing various aspects of the claimed subject matter includes a computer 1302. The computer 1302 includes a processing unit 1304, a system memory 1306, a codec 1335, and a system bus 1308. The system bus 1308 couples system components including, but not limited to, the system memory 1306 to the processing unit 1304. The processing unit 1304 can be any of various available processors. Dual microprocessors and other multiprocessor architectures also can be employed as the processing unit 1304.

The system bus 1308 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1294), and Small Computer Systems Interface (SCSI).

The system memory 1306 includes volatile memory 1310 and non-volatile memory 1312, which can employ one or more of the disclosed memory architectures, in various embodiments. The basic input/output system (BIOS), containing the basic routines to transfer information between elements within the computer 1302, such as during start-up, is stored in non-volatile memory 1312. In addition, according to present innovations, codec 1335 may include at least one of an encoder or decoder, wherein the at least one of an encoder or decoder may consist of hardware, software, or a combination of hardware and software. Although, codec 1335 is depicted as a separate component, codec 1335 may be contained within non-volatile memory 1312. By way of illustration, and not limitation, non-volatile memory 1312 can include read only memory (ROM), programmable ROM (PROM), electrically programmable ROM (EPROM), electrically erasable programmable ROM (EEPROM), or Flash memory. Non-volatile memory 1312 can employ one or more of the disclosed memory devices, in at least some embodiments. Moreover, non-volatile memory 1312 can be computer memory (e.g., physically integrated with computer 1302 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1310 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1302 may also include removable/non-removable, volatile/non-volatile computer storage medium. FIG. 13 illustrates, for example, disk storage 1314. Disk storage 1314 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1314 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1314 to the system bus 1308, a removable or non-removable interface is typically used, such as interface 1316. It is appreciated that storage devices 1314 can store information related to a user. Such information might be stored at or provided to a server or to an application running on a user device. In one embodiment, the user can be notified (e.g., by way of output device(s) 1336) of the types of information that are stored to disk storage 1314 or transmitted to the server or application. The user can be provided the opportunity to opt-in or opt-out of having such information collected or shared with the server or application (e.g., by way of input from input device(s) 1328).

It is to be appreciated that FIG. 13 describes software that acts as an intermediary between users and the basic computer resources described in the suitable operating environment 1300. Such software includes an operating system 1318. Operating system 1318, which can be stored on disk storage 1314, acts to control and allocate resources of the computer system 1302. Applications 1320 take advantage of the management of resources by operating system 1318 through program modules 1324, and program data 1326, such as the boot/shutdown transaction table and the like, stored either in system memory 1306 or on disk storage 1314. It is to be appreciated that the claimed subject matter can be implemented with various operating systems or combinations of operating systems.

A user enters commands or information into the computer 1302 through input device(s) 1328. Input devices 1328 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1304 through the system bus 1308 via interface port(s) 1330. Interface port(s) 1330 include, for example, a serial port, a parallel port, a game port, and a universal serial bus (USB). Output device(s) 1336 use some of the same type of ports as input device(s) 1328. Thus, for example, a USB port may be used to provide input to computer 1302 and to output information from computer 1302 to an output device 1336. Output adapter 1334 is provided to illustrate that there are some output devices 1336 like monitors, speakers, and printers, among other output devices 1336, which require special adapters. The output adapters 1334 include, by way of illustration and not limitation, video and sound cards that provide a means of connection between the output device 1336 and the system bus 1308. It should be noted that other devices or systems of devices provide both input and output capabilities such as remote computer(s) 1338.

Computer 1302 can operate in a networked environment using logical connections to one or more remote computers, such as remote computer(s) 1338. The remote computer(s) 1338 can be a personal computer, a server, a router, a network PC, a workstation, a microprocessor based appliance, a peer device, a smart phone, a tablet, or other network node, and typically includes many of the elements described relative to computer 1302. For purposes of brevity, only a memory storage device 1340 is illustrated with remote computer(s) 1338. Remote computer(s) 1338 is logically connected to computer 1302 through a network interface 1342 and then connected via communication connection(s) 1344. Network interface 1342 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1344 refers to the hardware/software employed to connect the network interface 1342 to the bus 1308. While communication connection 1344 is shown for illustrative clarity inside computer 1302, it can also be external to computer 1302. The hardware/software necessary for connection to the network interface 1342 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method of fabricating a first portion of a two-terminal memory device, comprising:
   forming a bottom electrode (BE) of the two-terminal memory device overlying a substrate;
   forming a BE insulator layer overlying the BE and the substrate;
   performing a first chemical-mechanical planarization (CMP) process that removes a first portion of the BE insulator layer overlying a top surface of the BE and removes a first portion of the BE; and
   performing a second CMP process that removes a second portion of the BE insulator layer and a second portion of the BE, and exposes top surfaces of the BE insulator layer and a top surface of the BE, wherein a step height between the top surfaces of the BE insulator layer and the top surface of the BE is less than two nanometers.

2. The method of claim 1, wherein the top surface of the BE is approximately planar characterized as having no two locations of the top surface differing in height by more than about two nanometers.

3. The method of claim 1, wherein the BE comprises at least one material selected from a group consisting essentially of: TiN, TaN, and W.

4. The method of claim 1, further comprising forming a BE gapfill dielectric layer overlying the BE insulator layer.

5. The method of claim 4, wherein the BE gapfill dielectric layer comprises at least one material selected from a group consisting essentially of: a-Si, SiN, a-SiC, and nitrogen doped a-SiC, SiO$_2$, FSG, and other low-k dielectrics.

6. The method of claim 1, wherein the BE insulator layer comprises a material selected based on:
   a first property characterized as having a first removal rate ratio in a range of about 0.5:1 to about 4:1, wherein the first removal rate ratio represents a ratio in response to the first CMP process of a first removal rate of the BE insulator layer to a first removal rate of the BE; or
   a second property characterized as having a second removal rate ratio greater than about 5:1, wherein the second removal rate ratio represents a ratio in response to the second CMP process of a second removal rate of the BE to a second removal rate of the BE insulator layer.

7. The method of claim 1, wherein the BE insulator layer comprises a material selected based on:
   a third property characterized as mitigating oxidization to the BE or a switching layer during the fabricating;
   a fourth property characterized as having an oxygen content that is less than about two percent;
   a fifth property characterized as preventing, during operation of the two-terminal memory device, an electrical conduction path; or
   a sixth property characterized as non-interaction with the switching layer or preventing changes to electrical characteristics of the switching layer.

8. The method of claim 1, wherein the BE insulator layer comprises at least one material selected from a group consisting essentially of: a-Si, SiN, a-SiC, and nitrogen doped a-SiC.

9. The method of claim 1, further comprising forming a switching layer overlying the BE and the BE insulator layer.

10. The method of claim 9, wherein the switching layer comprises at least one material selected from a group consisting essentially of: SiO, SiO$_2$, SiN, HfO$_2$, and a-Si.

11. The method of claim 9, wherein the switching layer has a thickness in a range of about one nanometer to about seven nanometers.

12. The method of claim 11, wherein the thickness of the switching layer is approximately constant characterized as being approximately a same thickness at a first location overlying a central portion of the BE, a second location overlying a left edge of the BE, and a third location overlying a right edge of the BE.

13. A method of fabricating a second portion of a two-terminal memory device, comprising:
   forming a top electrode (TE) of the two-terminal memory device overlying a switching layer overlying a bottom electrode (BE) and an insulator material;
   patterning the TE and the switching layer and removing portions of the TE and the switching layer overlying the insulator material;
   forming a TE insulator layer overlying the TE and the insulator material;
   performing a first chemical-mechanical planarization (CMP) process that removes a first portion of the TE insulator layer overlying a top surface of the TE and that removes a first portion of the TE; and
   performing a second CMP process that removes a second portion of the TE insulator layer and a second portion of the TE, and exposes top surfaces of the TE insulator layer and a top surface of the TE, wherein a step height between the top surfaces of the TE insulator layer and the top surface of the TE is less than two nanometers.

14. The method of claim 11, wherein the top surface of the TE is approximately planar characterized as no two locations of the top surface differing in height by more than two nanometers.

15. The method of claim 11, wherein the TE insulator layer has a thickness in a range of about three nanometers to about seven nanometers.

16. The method of claim 11, wherein the TE insulator layer comprises a material selected based on:
   a first property characterized as having a first removal rate ratio in a range of about 0.5:1 to about 4:1, wherein the first removal rate ratio represents a ratio in response to the first CMP process of a first removal rate of the TE insulator layer to a first removal rate of the TE; or
   a second property characterized as having a second removal rate ratio greater than about 5:1, wherein the second removal rate ratio represents a ratio in response to the second CMP process of a second removal rate of the TE to a second removal rate of the TE insulator layer.

17. The method of claim 11, wherein the TE insulator layer comprises a material selected based on:
- a third property characterized as mitigating oxidization to the TE or the switching layer during the fabricating;
- a fourth property characterized having an oxygen content that is less than about four percent;
- a fifth property characterized as mitigating diffusion of material of the TE to other portions of the two-terminal memory device; or
- a sixth property characterized as non-interaction with the switching layer or the TE or preventing changes to electrical characteristics of the switching layer or the TE.

18. The method of claim 11, wherein the TE insulator layer comprises at least one material selected from a group consisting essentially of: a-Si, SiN, a-SiC, and nitrogen doped a-SiC.

19. The method of claim 11, wherein the TE has a width greater than a width of the BE.

20. The method of claim 11, wherein the switching layer has a width greater than a width of the BE.

* * * * *